United States Patent

Cucchi et al.

[11] Patent Number: 6,046,645
[45] Date of Patent: Apr. 4, 2000

[54] METHOD AND DEVICE FOR THE DIGITAL CONTROL OF A PHASE-LOCKED LOOP AND RELATIVE PHASE-LOCKED LOOP THUS OBTAINED

[75] Inventors: Silvio Cucchi; Michele Marchiori, both of Arcore; Marzio Orsucci, Vimercate, all of Italy

[73] Assignee: Alcatel, Paris, France

[21] Appl. No.: 09/209,446

[22] Filed: Dec. 11, 1998

[30] Foreign Application Priority Data

Dec. 16, 1997 [IT] Italy ................................. MI97A2772

[51] Int. Cl.$^7$ ............................... H03L 7/00; H03L 7/087
[52] U.S. Cl. ............................... 331/1 R; 331/11; 331/17; 331/25; 327/159; 375/376
[58] Field of Search ...................... 331/1 R, 1 A, 331/11, 17, 25; 327/156–159; 375/376

[56] References Cited

U.S. PATENT DOCUMENTS 5,533,050  7/1996  Isard et al. ............................. 375/229

OTHER PUBLICATIONS

ITU–T Recommendation I.363 (Mar. 1993) B–ISDN ATM Adaptive Layer Type (AAL1)pp. 1–96.

*Primary Examiner*—David Mis
*Attorney, Agent, or Firm*—Sughrue, Mion, Zinn Macpeak & Seas, PLLC

[57] ABSTRACT

A method is described for the digital control of a phase-locked loop consisting in the separate estimation of both phase and frequency errors of the data source as compared with those of the local oscillator and in the separate and adaptive filtering of the two signals. The value of the VCO control voltage is calculated on the basis of the two filtered signals. The phase and frequency error estimation and the frequency and phase error filtering are carried out in such a way as to eliminate the time-varying random components titter and noise) without delaying the feedback signals, since the portion of the signals that varies with time because of the variation of the commands, is subtracted before estimations and filterings.

23 Claims, 3 Drawing Sheets

METHOD AND DEVICE FOR THE DIGITAL CONTROL OF A PHASE-LOCKED LOOP AND RELATIVE PHASE-LOCKED LOOP THUS OBTAINED

BACKGROUND OF THE INVENTION

The present invention relates to a method and device for the digital control of a phase-locked loop comprising a voltage controlled oscillator, and to the relative phase-locked loop thus obtained.

In real-time signal transmission systems, the reference or sync frequency information of a data source is usually sent towards reception, in a manner also independent from the transmission of the data source itself. To do so, a measure of the source frequency referred to the system transmission frequency is used, which is known also in reception, when the network configuration allows it.

More particularly, even if not exclusively, in the video systems it is important to be able to reconstruct in reception the source sync signal with high accuracy.

A known technique used for transmitting the timing information consists in sampling the phase of the source with the signal which is obtained by dividing the transmission frequency. Another known technique is based on the use of the Synchronous Residual Time Stamp (SRTS), described e.g. in the Recomendation 1.363 "ATM Adaptation Layer type 1 (AAL1)".

In reception, this time information is used to lock a local clock onto the data source frequency.

If the network frequency reference is unavaible at the data source, or the high reception jitter, using e.g. the ATM technology, does not allow the effective use of the SRTS technique, the techniques described above are no longer suitable to assure high performances in terms of accuracy in the sync signal reconstructed in reception and of lock quickness.

SUMMARY OF THE INVENTION

Therefore, the object of the present invention is to overcome the aforesaid drawbacks, mainly that which is connected with the introduction of a large jitter in the information related to the source sync signal, and to provide a digital phase-locked loop which, by exploiting the resources offered by the digital signal processing, is capable of achieving a jitter rejection also at very low frequencies, still maintaining good reaction times when the frequency or phase error of the local oscillator with respect to the source is large.

In order to achieve these objects, the present invention provides a method for the digital control of a phase-locked loop in accordance with claims 1 to 13 that are an integral part of the present description.

The present invention also provides a device for the digital control of a phase-locked loop in accordance with claims 14 to 22 that are an integral part of the present description.

The present invention further provides a phase-locked loop in accordance with claim 23 that is an integral part of the present description.

The present invention is based on the underlying idea consisting in the separate estimation of both phase and frequency errors of the data source as compared with the local oscillator ones and in the separate and adaptive filtering of the two signals.

The invention is also characterized by a digital command generator, which is fed by the aforesaid two signals being filtered and calculates the value of the VCO control voltage.

The command generator further carries out a digital simulation of the VCO analog control signal, thus obtaining an estimate of the actual control signal which is essential for the correct operation of the filtering and error estimation blocks.

The phase and frequency error estimations and the filtering of the frequency and phase error are carried out in such a way as to eliminate the time varying random components (jitter and noise) without delaying the feedback signals, since the portion of the signals which varies with time, because of the variation of the commands, is subtracted before estimations and filterings (FIG. 1).

In essence it concerns a digital phase-locked loop with a performer portion implemented analogically and with a measurement and control portion realized with a sampling digital system.

The system according to the invention is quite advantageously used for determining, with the highest accuracy, the clock frequency to drive the depletion of the data input buffer of a system for receiving ATM (Asynchronous Transfer Mode) flows. More particularly, in a system for receiving a MPEG-coded video signals transmitted over a packet network, the system according to the invention provides the video clock signal reconstructed in reception with extreme accuracy and stability.

BRIEF DESCRIPTION OF THE DRAWING

The digital phase-locked loop according to the invention has the basic advantage of featuring a quick phase lock for large frequency and phase errors and, at the same time, has a significant low frequency jitter rejection. Further objects and advantages of the present invention will result clear from the following detailed description of an embodiment thereof and from the attached drawings given as a non limiting example in which.

DETAILED DESCRIPTION OF THE INVENTION

Figure 1:
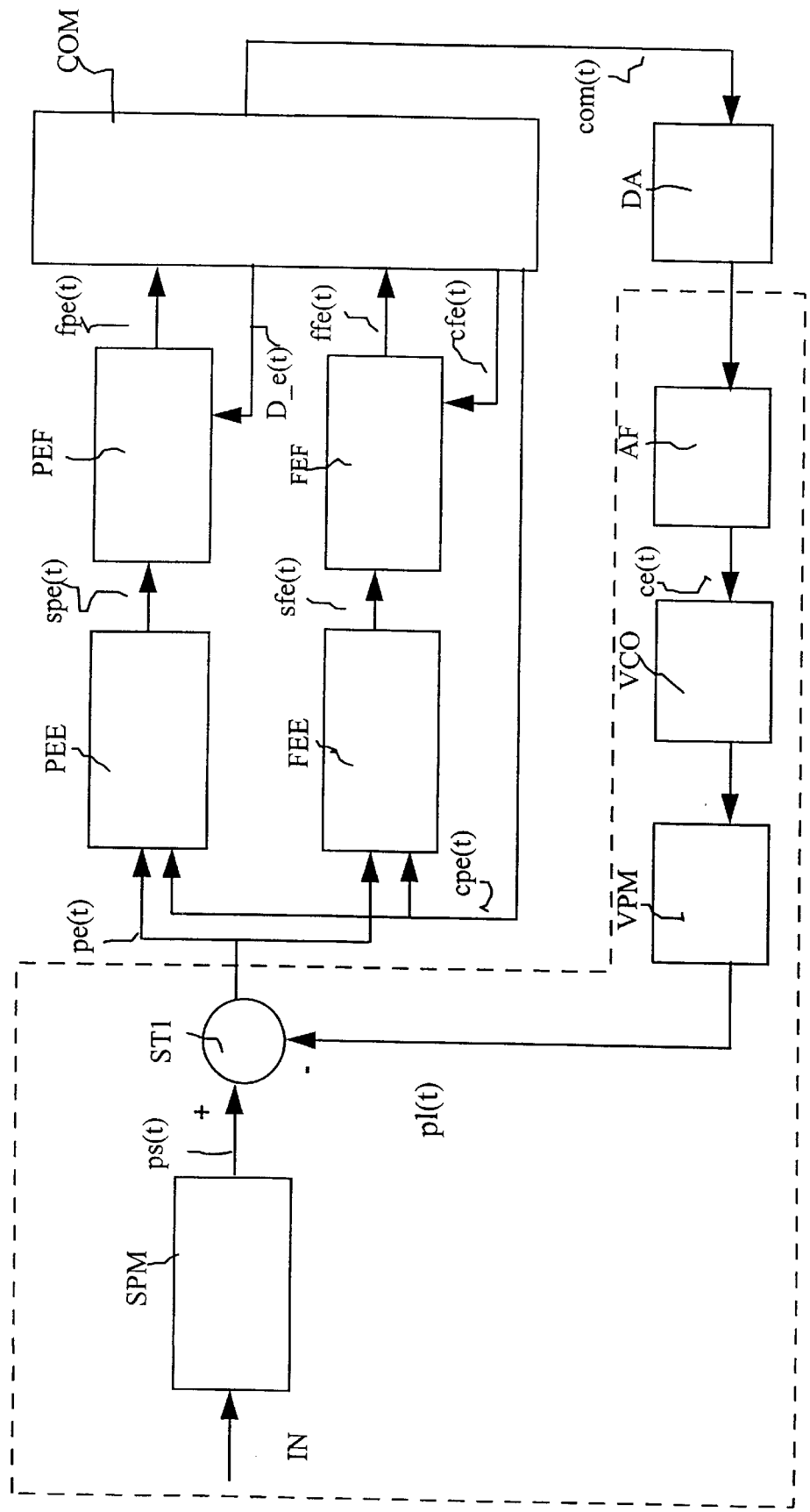
FIG. 1 is a functional block diagram of the phase-locked loop according to the present invention.

In FIG. 1, the input signal IN is a generic signal from a transmission line, as a non limiting example an asynchronous packet signal, type ATM (Asynchronous Transfer Mode), or a plesiochronous signal, i.e. a signal which can be continuous or discontinuous according to the circumstances.

Moreover, for the more general case, the transmission frequency can be both constant and variable.

SPM stands for a block that extracts from the input signal the phase information according to which the reference frequency, which the system of FIG. 1 has to be locked on, is established. SPM allows the operation of the rest of the loop to be adapted to all types of input signals listed above.

The structure of SPM, substantially of a known type, outputs a signal ps(t) consisting in a measure of phase, for instance formed by measurement of the number of bits received by SPM per unit of time. As a non limiting example, the input signal can have a frequency of 34 Mb/s, while the time unit can be 10 ms.

A signal pl(t) formed by the measure of the local phase, is substracted from the signal ps(t) in a conventional substractor ST1, thus obtaining a phase error signal pe(t), that is fed to the input of two blocks, respectively a phase estimation block PEE and frequency error estimation block FEE, which output respective signals spe(t) and sfe(t) of said estimations.

PEF and FEF stand for two adaptive digital filters that filter the phase spe(t) and frequency sfe(t) error estimation signals respectively, and output respective filtered signals fpe(t) and ffe(t).

Signals fpe(t) and ffe(t) are fed to a block COM generating a command signal com(t) for the voltage controlled local oscillator VCO and feedback signals for the filter PEF and FEF themselves, and for the phase and frequency estimators PEE and FEE.

The feedback signals are used for subtracting from the estimation and filtering process the portion of the signals that varies with time because of the variation of the commands, thus allowing only the processing of the time-varying random components titter and noise) speeding up the system.

DA and AF respectively designate a digital-to-analog converter and a common low-pass analog filter for transforming the command digital signal com(t) emitted by COM into an analog signal ce(t) for controlling the VCO oscillation frequency.

The VCO output frequency is integrated in a conventional integrator VPM that outputs the local phase measure signal pl(t).

The phase PEE and frequency FEE error estimators have as their inputs the time phase errors pl(t), and a simulation of the time local oscillator frequency corrections cpe(t). The latter signal, also produced by block COM, simulates the frequency correction corresponding to the command on the VCO provided by the analog filter AF, that is to say it is a digital estimate of ce(t).

This because the phase error varies with time both because of the jitter (or in general because of the noise) and because of the applied command. In order to be able to filter only the unwanted components (jitter and noise), it is necessary to subtract the component deriving from command cpe(t), which is time-varying. In this way only the noise and jitter component remain a function of time, speeding up the system, as already said above.

The blocks of FIG. 1 bordered by a broken line, i.e. blocks SPM, ST1, AF, VCO, VPM, form an analog part of the loop, while the others form a digital part. These latter are detailed better with reference to FIG. 2.

A possible non limiting embodiment of blocks PEE and FEE uses the least squares estimation applied to a number of phase error measurements, carried out at different times, to obtain the estimate signals spe(t) and sfe(t).

PEE calculates the least squares line not only on the simple signal pe(t), but on pe(t) from which the effect produced by the control applied to the VCO (signal cpe(t)) is subtracted.

In considering these phase error values it is necessary to take account of the fact that there is control voltage applied to the local oscillator VCO, that modifies its frequency according to the law $F_c = F_o + K_{vco} * V$, where V is a voltage that changes with time according to the control requirements and therefore with known values, while $K_{vco}$ is the proportionality constant between the frequency and voltage of the VCO, which is a fixed value but known a priori only with a certain approximation that, on the other hand, is sufficient to keep the system stability unaltered in the steady state.

Let $t_i$ be an indefinite sequence of instants of measurement and $\Phi_i$ the corresponding phase error measures at the input of PEE, formed by signal pe(t). Further, let L be the length of a buffer in which times and measures are registered.

Let $C_i$ (having the dimension of a frequency) denote the control values of $K_{vco} * V_i$ applied at the instants $t_i$ corresponding to the sampled values of signal cpe(t) calculated by block COM.

The computation algorithm in PEE (and also in FEE) consists in calculating, at each $i^{th}$ instant, the straight line that best fits, according to the least squares (MSR), the set of measures $\Phi_k$ (k being comprised between i and i−L+1) after having subtracted from them the contribution provided by the commands to VCO.

For the computation of the line, the zero on the axis of times is taken at $t_1$ and the value measured at that same instant is taken as a phase reference. Let us define again $T_o$, $T_1, T_2, \ldots T_k, \ldots T_{L-1}$ the instants of time starting from $t_1$ and going backwards.

The phase error measures, depurated of the commands at the preceding instants, become:

$$z_0 = \Phi_0$$
$$z_1 = \Phi_1 - C_1 \cdot (T_0 - T_1)$$
$$z_2 = \Phi_2 - C_1 \cdot (T_0 - T_1) - C_2 \cdot (T_1 - T_2)$$

$$z_k = \Phi_k - \sum_{n=1}^{k} C_n \cdot (T_{n-1} - T_n)$$

The $Z_k$ values are those taken into account in calculating the least squares.

If $z = a \cdot T + b$ indicates the line of best fit, the values of the parameters a and b are obtained from the equations:

$$\begin{cases} \left(\sum_{k=1}^{L-1} T_k^2\right) \cdot a + \left(\sum_{k=1}^{L-1} T_k\right) \cdot b = \sum_{k=1}^{L-1} z_k \cdot T_k \\ \left(\sum_{k=1}^{L-1} T_k\right) \cdot a + L \cdot b = \sum_{k=1}^{L-1} z_k \end{cases}$$

From the parameters a, b of the straight line, block PEE calculates the phase error spe(t) obtained by extrapolating the line at next instant ($t_{i+1}$), i.e. the value of the line of best fit at the instant ($t_{i+1}$).

On the contrary, the block FEE calculates the frequency error sfe(t) corresponding to the slope a of the line, hence on the basis of the incremental ratio of the estimated values.

Figure 2:
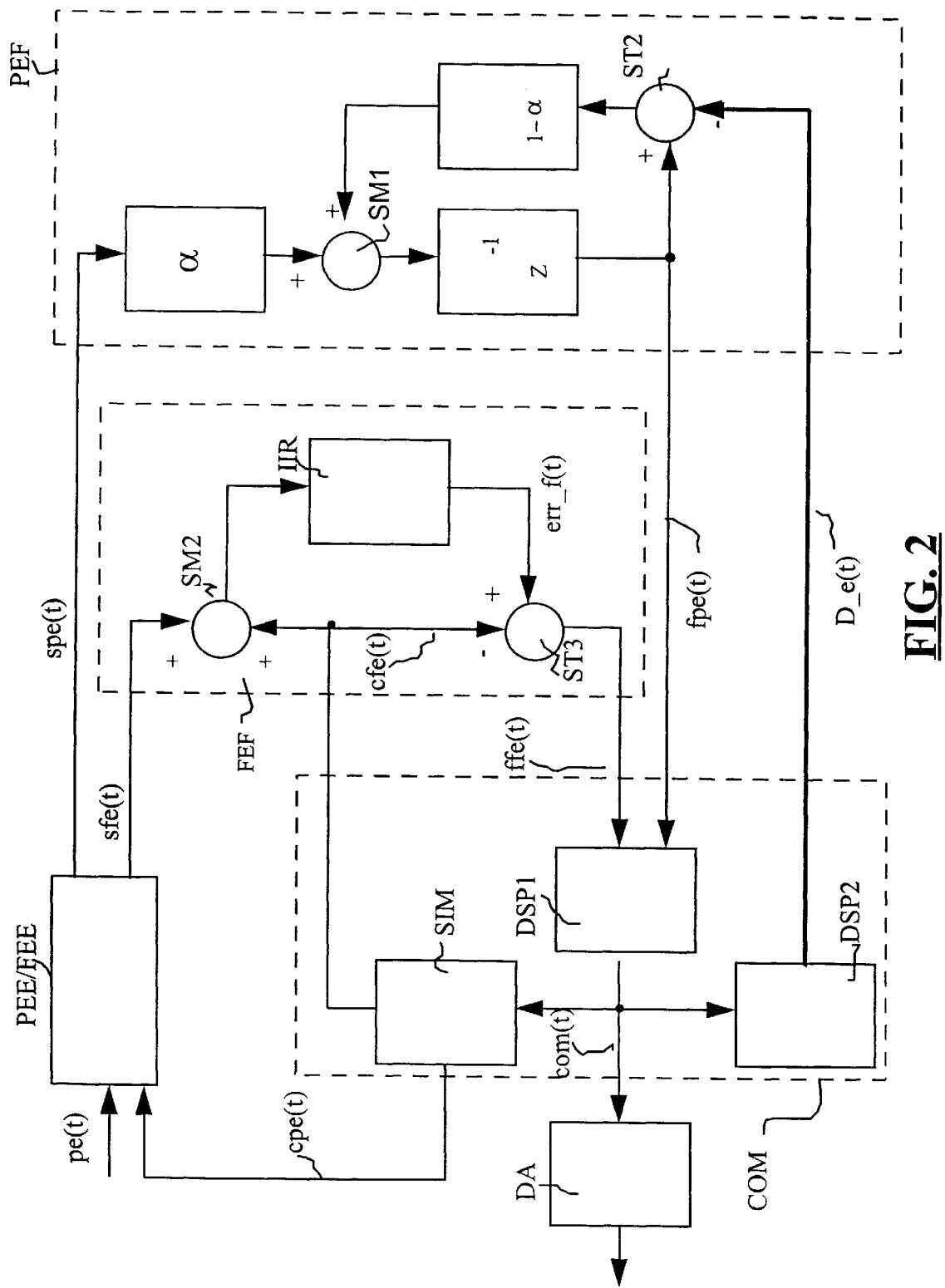
FIG. 2 shows a more detailed block diagram thereof.

Referring to FIG. 2, where like references refer to like blocks and signals of FIG. 1, in the following there is described the structure and the operation mode of the phase error filter (dashed block PEF).

As already said, the phase error varies with time, because of the jitter and of the noise. In order to be able to filter these undesired components let us suppose to apply an adaptive digital filtering, for instance formed by a transverse IIR (Infinite Impulse Response) filter, to the phase estimation signal spe(t+1), taken at the next instant, thus obtaining a filtered phase estimation signal fpe(t) given, according to a formula generally known per se for a type of IIR filters, by:

$$fpe(t) = (1-\alpha)fpe(t-1) + \alpha spe(t)$$

Since, as will be better explained hereinafter, we propose to recover the phase error step by step of a given percentage only, designated by D_e(t), of the estimated error, then the phase error estimated at time t, for the general case will be:

$$spe(t)=fpe(t-1)-D\_e(t)+n(t)$$

Substituting the latter equation into the preceding one, we obtain:

$$fpe(f)=(1-\alpha)fpe(t-1)+\alpha[fpe(t-1)-D\_e(t)+(t)]==fpe(t-1)-\alpha D\_e(t)+\alpha n(t)$$

In order to have a noise filtering with a very narrow band it is necessary for α to be small. This would entail, according to the preceding formula, that also D_e(t) has to be deeply filtered, however introducing an unacceptable delay in the correct evaluation of fpe(t) which would led to the instability of the system. Therefore, what is actually wished to obtain at once is a correct evaluation of fpe(t) as compared with the preceding value, namely:

$$fpe(t)=fpe(t-1)-D\_e(t)+\alpha n(t)$$

In order to obtain this kind of filtering, it is necessary to subtract D_e(t) from fpe(t−1) in the general formula of the IIR filter given above, thus obtaining:

$$fpe(t)=(1-\alpha)[fpe(t-1)-D\_e(t)]+\alpha spe(t)$$

This latter formula is realized by block PEF of FIG. 2 in which: the input signal spe(t) is multiplied by a in a respective multiplier and then is provided by means of an adder SM1 to a delay line $Z^{-i}$ of a bit time that outputs the signal fpe(t); signal D_e(t) from block COM is subtracted fom signal fpe(t) in a subtractor ST2 whose output is multiplied by (1−α) in a respective multiplier, whose output is provided to the adder SM1.

The structure of PEF is the structure of a transverse digital IIR filter modified for having added the subctraction of D_e(t) from fpe(t).

An IIR filter is preferably chosen instead of a FIR (Finite Impulse Response) filter because a narrow-band filtering can be obtained with only one delay element, which otherwise would require N taps in a FIR filter. This, however, does not restrict the possibility of selecting other structures among both linear and non linear ones.

The constant α inside the IIR filter can be made adaptive so that the PLL band will adapt itself to the various lock or unlock conditions (i.e. phase error more or less large). In this way the system reacts quickly for large errors and keeps stable for small errors.

Said constant α decreases with time until it reaches an asymptotic value $\alpha_{AS}$:

$$\alpha(t+1)=\alpha(t)+K_{PEF}\cdot(\alpha_{AS}-\alpha(t))$$

The value of α is initialized at the start and during operation it is reset to generally higher values which depend on phase spe(t) and frequency sfe(t) error values, according to a law of the kind:

$$\alpha=f(spe, sfe)$$

in which α approaches zero as both spe and sfe approach zero, while α approaches a finite value when spe and sfe are over a certain threshold.

Still referring to FIG. 2, the structure and the operation mode of the frequency error filter (dashed block FEF) are described below.

Also the frequency error varies with time because of the random components and because of the commands applied previously, hence the purpose of the filtering is to eliminate the random components, i.e. the jitter. The estimated frequency error claculated by FEF is given by:

$$sfe(t)=f_{sorg}(t)-f_{loc}(t)+\text{jitter}(t)$$

where $f_{sorg}(t)$ is the transported-data source frequency, while $f_{loc}(t)$ is the effective value calculated by COM.

The frequency correction made, calculated by COM, is given by:

$$cfe(t)=f_{loc}(t)-f_{nom\_loc}(t)$$

where $f_{nom\_loc}(t)$ is the frequency of the nominal command local oscillator.

The signal at the input of the filter FEF is:

$$sfe(t)+cfe(t)=f_{sorg}(t)+\text{jitter}(t)-f_{nom\_loc}(t)$$

which depends on time only through the jitter that however can be deeply filtered, thus minimizing this component. This signal is then filtered for instance by means of an IIR filter at the output of which is a signal err_f(t) given by:

$$\text{err}\_f(t)=f_{sorg}(t)+\text{jitter}_{res}(t)-f_{nom\_loc}(t)$$

Thus, at the input of block COM is the signal:

$$ffe(t)=f_{sorg}(t)+\text{jitter}_{res}(t)-f_{nom\_loc}(t)-cfe(t)==f_{sorg}(t)+\text{jitter}_{res}(t)-f_{nom\_loc}(t)-f_{loc}(t)-cfe(t)==f_{sorg}(t)-f_{loc}(t)+\text{jitter}_{res}(t)$$

This value represents the difference between the objective and the local frequency value, apart from a very small residual component $\text{jitter}_{res}(t)$, which is a function of time.

Hence, from FIG. 2 it is apparent that signals sfe(t) and cfe(t) are summed in an adder SM2 and fed to an IIR transverse digital filter that filters the undesired component of the jitter, outputting the signal err_f(t), defined above; from the latter, the signal cfe(t) is subctracted in a subctractor ST3 supplying the signal ffe(t) to block COM.

Still referring to FIG. 2, the structure and the operation mode of the command generator (dashed block COM) are described below.

COM is comprised of the following four sub-blocks:

Block DSP1: this block calculates the command com(t), to be applied to VCO, which is subdivided into two separate components, one recovering the frequency and one recovering the phase:

$$com(t)=F1[ffe(t)]+F2[K_{FPE}\cdot fpe(t)]$$

where F1 is a frequency error funcion and F2 is a phase error function. For example:

$$F1=1/K_{vco}$$

and $$F2=F1/\Delta T$$

where $K_{vco}$ is the constant defined above, while $\Delta T$ is the reference time interval, for instance a bit time.

Figure 3:
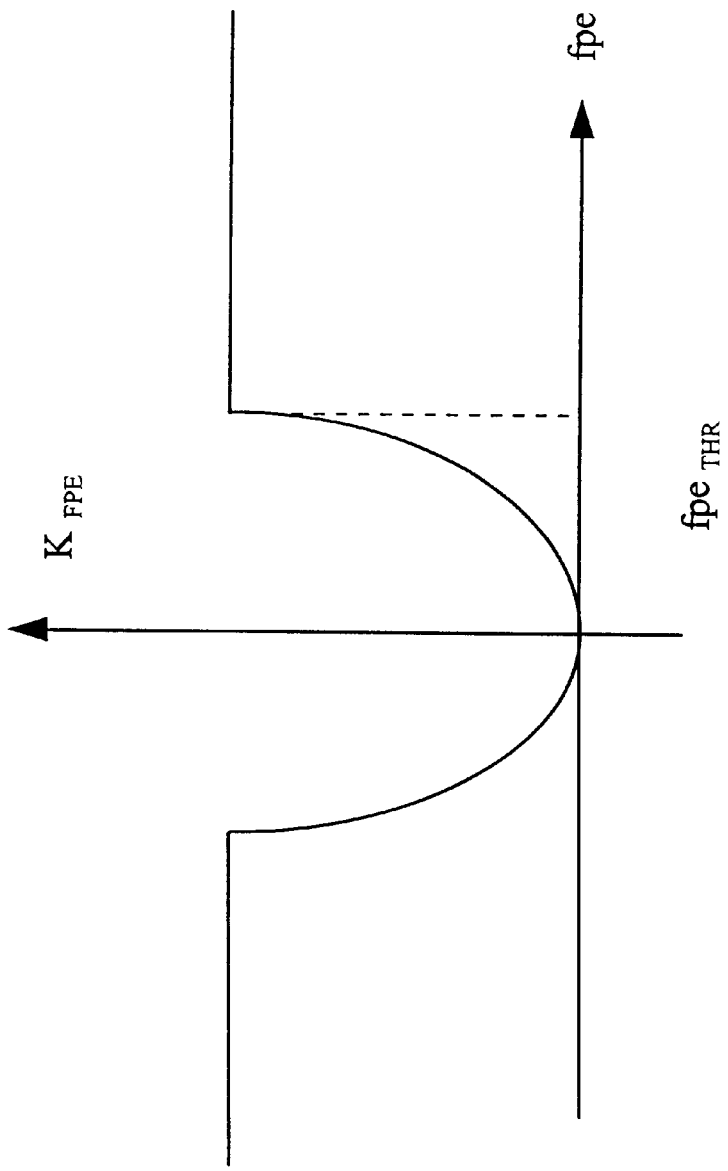
FIG. 3 shows the waveform of a control signal of the loop.

The frequency error is totally recovered at next instant, while the phase error is partially recovered according to a non-linear law $K_{FPE}$, a function of the phase error, which creates a compression of the error recovery for small errors, for instance by using a square function as depicted in FIG. 3.

For phase errors below a threshold value $fpe_{THR}$, the value of $K_{FPE}$ varies according to a square law approaching zero for small errors and approaching a saturation value as the error approaches the threshold value $fpe_{THR}$. The threshold and the saturation can be made adaptive in function of the discovered error rate.

The variation of command com(t) as compared with the preceding value is thus restricted with a saturation law which depends upon the phase error and upon time. This saturation is due to the physical restrictions of the VCO and to system stability problems.

Block SIM: it carries out a digital simulation of the analog filter AF downstream of converter DA: namely, given the input value com(t), it digitally evaluates the value of ce(t) and transforms it into a predicted command value cpe(t) supplied to blocks PEE, FEE (FIG. 1).

SIM further calculates the signal cfe(t) to be fed to block FEF. As said above, $cfe(t)=f_{loc}(t)-f_{nom\_loc}(t)$, where $f_{nom\_loc}$ is a constant value given, e.g., by $f_{nom\_loc}(t)=V_N K_{VCO}$, $V_N$ being the VCO nominal voltage, while $f_{loc}(t)$ is the numeric value calculated on the basis of the instantaneous value of the command signal com(t).

Block DSP2: it derives from the same input value com(t) a simulation of the phase recovery value D_e(t) which takes account of the saturation, used in the phase error filtering. D_e(t) is the actual unfiltered phase recovery of the system at next step: this value is subtracted from fpe(t) to make the system faster and to work things in such a way that the filter filters the noise (jitter) only, eliminating the component relative to the command.

From the above description of the performed functions and of the operation mode, the actual realization of the circuit according to the invention is not a problem to a person skilled in the art, for instance by means of suitably programmed microprocessor units.

Variations to the non limiting embodiment described above are possible such as e.g.: use of higher degree IIR filters or FIR filters or even non linear filtering networks. An algorithm different from the least squares one can be used to fit a straight line to the set of phase error measures.

What is claimed is:

1. A method for the digital control of a phase-locked loop, comprising a voltage controlled oscillator (VCO), characterized in that the following steps are provided:

calculating a first difference pe(t) between a phase of an input signal ps(t) and a local phase pl(t) of the signal produced by said voltage controlled oscillator (VCO);

calculating digital estimates of both phase spe(t) and frequency sfe(t) errors of said first difference pe(t);

carrying out a separate adaptive digital filtering of said digital estimates of phase spe(t) and frequency sfe(t) errors, obtaining respective phase fpe(t) and frequency ffe(t) filtered digital signals;

calculating a command signal com(t) for said voltage controlled oscillator (VCO) constituted by a combination of the contributions by said phase fpe(t) and frequency ffe(t) filtered digital signals.

2. A method according to claim 1, characterized in that it further comprises the step of calculating the feedback signals (cpe(t), cfe(t), D_e(t)) to be subctracted from said phase spe(t) and frequency sfe(t) error digital estimates and from said separate adaptive digital filterings, said feedback signals forming a time-varying component because of variation in the commands, allowing through said subtraction the processing of the time-varying random components only.

3. A method according to claim 2, characterized in that it further comprises the following steps:

calculating a digital simulation signal cpe(t) of the phase correction made in said voltage controlled oscillator (VCO) according to said command signal com(t), said digital simulation signal cpe(t) forming one of said feedback signals;

calculating said phase spe(t) and frequency sfe(t) error digital estimates on a digital signal formed by said first difference pe(t) having subtracted said digital simulation signal cpe(t) therefrom.

4. A method according to claims 2 or 3, characterized in that it further comprises the following steps:

calculating a simulation of the phase recovery D_e(t) made on said voltage controlled oscillator (VCO) on the basis of said command signal com(t), said phase recovery simulation forming one of said feedback signals;

carrying out said adaptive digital filtering of said phase error digital estimate spe(t) having subtracted therefrom the contribution given by said phase recovery simulation D_e(t).

5. A method according to claim 2 or 3, characterized in that it further comprises the following steps:

calculating a simulation of the frequency correction cfe(t) made on said voltage controlled oscillator (VCO) on the basis of said command signal com(t), said frequency correction simulation forming one of said feedback signals;

carrying out said adaptive digital filtering of said frequency error digital estimation sfe(t) having subtracted therefrom the contribution given by said frequency correction simulation cfe(t).

6. A method according to claim 3, characterized in that said calculation of the phase spe(t) and frequency sfe(t) error digital estimates is carried out through an estimation of the least squares line applied to a certain sequence of estimates at subsequent instants.

7. A method according to claim 6, characterized in that said least squares line estimation comprises the steps of:

calculating a first sum ($z_k$):

$$z_k = \Phi_k - \sum_{n=1}^{k} C_n \cdot (T_{n-1} - T_n)$$

where k is the number of subsequent instants, $\Phi_K$ denotes the phase error measures, $C_n$ denotes the variations of the control applied to the voltage controlled oscillator (VCO);

calculating a first system on the basis of said first sum ($z_k$):

$$\left\{ \left( \sum_{k=1}^{L-1} T_k^2 \right) \cdot a + \left( \sum_{k=1}^{L-1} T_k \right) \cdot b = \sum_{k=1}^{L-1} z_k \cdot T_k \right.$$

-continued $$\left|\left(\sum_{k=1}^{L-1} T_k\right) \cdot a + L \cdot b = \sum_{k=1}^{L-1} z_k\right.$$

obtaining said line of least squares as: z=a·T+b, from which said error spe(t) is derived through an extrapolation of said line at the next instant ($t_{i+1}$) namely the value of the line at the instant ($t_{i+1}$), while said frequency error spe(t) corresponds to the slope (a) of the line.

8. A method according to claim 1, characterized in that said adaptive digital filtering of said phase error digital estimate spe(t) is carried out by means of a first IIR (Infinite Impulse Response) adaptive filtering.

9. A method according to claim 8, characterized in that said first IIR adaptive filtering calculates the following expression:

$$fpe(t)=(1-\alpha)[fpe(t-1)-D\_e(t)]+\alpha spe(t)$$

where α is a constant of the filter.

10. A method according to claim 9, characterized in that said constant α is made adaptive according to the following expression:

$$\alpha(t+1)=\alpha(t)+K_{PEF}\cdot(\alpha_{AS}-\alpha(t))$$

according to which α decreases with time up to an asymptotical value $\alpha_{AS}$.

11. A method according to claim 1, characterized in that said adaptive digital filtering of said frequency error digital estimate sfe(t) is carried out by means of a second IIR adaptive filtering.

12. A method according to claim 1, characterized in that said command signal com(t) for said voltage controlled oscillator (VCO) is formed by a combination of the contributions of said phase fpe(E) and frequency ffe(t) filtered digital signals, such that the frequency error is totally recovered at next instant, while the phase error is recovered only partially.

13. A method according to claim 12, characterized in that said command signal com(t) is derived according to the following equation:

$$com(t)=F1[ffe(t)]+F2[K_{FPE}\cdot fpe(t)]$$

where F1 and F2 are two constants; $K_{FPE}$ is a non-linear function varying according to the phase error fpe(t), which creates a compression in the phase error recovery for small errors, while it approaches a saturation value for errors higher than a threshold value.

14. A device for digitally controlling a phase-locked loop, including a voltage controlled oscillator (VCO), characterized in that it comprises:

first subctraction means (ST1) for calculating a first difference pe(t) between a phase of an input signal ps(t) and a local phase pl(t) of the signal produced by said voltage-controlled oscillator (VCO);

means (PEE, FEE) for calculating digital estimates of a phase spe(t) and frequency sfe(t) error of said first difference pe(t);

means (PEF, FEF) for carrying out a separate adaptive digital filtering of said digital estimates of phase spe(t) and frequency sfe(t) errors, which derive respective phase fpe(t) and frequency ffe(t) filtered digital signals;

means (COM) for calculating a command signal com(t) for said voltage controlled oscillator (VCO) formed by a combination of the contributions of said phase fpe(t) and frequency ffe(t) filtered digital signals.

15. A device according to claim 14, characterized in that it further comprises means (SIM) for calculating a digital simulation signal cpe(t) of the phase correction made on said voltage controlled oscillator (VCO) on the basis of said command signal com(t), said digital estimate computation means (PEE, FEE) calculating said phase spe(t) and frequency sfe(t) error digital estimates on a digital signal formed by said first difference pe(t) having subtracted said digital simulation signal cpe(t) therefrom.

16. A device according to claim 15, characterized in that said digital estimate computation means (PEE, FEE) carries out said calculation of phase spe(t) and frequency sfe(t) error digital estimates by means of an estimation of the least squares line applied to a certain sequence of estimates at subsequent instants.

17. A device according to any of claims 14 to 16, characterized in that it further comprises means (DSP2) for calculating a simulation of the phase recovery D_e(t) made on said voltage controlled oscillator (VCO) on the basis of said command signal com(t), said means (PEF) for adaptively digitally filtering said phase error digital estimate spe(t) carrying out said adaptive digital filtering of said phase error digital estimate having subtracted the contribution given by said phase recovery simulation D_e(t) therefrom.

18. A device according to any of claims 14 to 16, characterized in that it further comprises means (SIM) for calculating a simulation of the frequency recovery cfe(t) made on said voltage controlled oscillator on the basis of said command signal com(t), said means (FEF) for adaptively digitally filtering said frequency error digital estimate sfe((t) carrying out said adaptive digital filtering of that frequency error digital estimate sfe(t) having subtracted the contribution given by said frequency recovery simulation cfe(t) therefrom.

19. A device according to claim 14, characterized in that, for said adaptive digital filtering of said phase error digital estimate spe(t), it comprises a first IIR adaptive filter (PEF) which performs the following expression:

$$fpe(t)=(1-\alpha)[fpe(t-1)-D\_e(t)]+\alpha spe(t)$$

where α is a constant of the filter.

20. A device according to claim 14, characterized in that, for said adaptive digital filtering of said frequency error digital estimate sfe(t), it comprises a second IIR adaptive filter (FEF).

21. A device according to claim 14, characterized in that said means (COM) for calculating a command signal com(t) for said voltage controlled oscillator (VCO) determines said command signal com(t) on the basis of a combination of the contributions of said phase fpe(t) and frequency ffe(t) filtered digital signals, such that the frequency error is totally recovered at next instant, while the phase error is recovered only partially.

22. A device according to claim 21, characterized in that said computation means (COM) determines said command signal com(t) according to the following equation:

$$com(t)=F1[ffe(t)]+F2[K_{FPE}\cdot fpe(t)]$$

where F1 and F2 are two constants; $K_{FPE}$ is a non-linear law, a function of the phase error fpe(t), which creates a compression of the phase error for small errors, while approaches a saturation value for errors above a threshold value.

23. A phase-locked loop including a voltage controlled oscillator (VCO) and a device for digitally controlling the phase-locked loop, said device comprising:

first subctraction means (ST1) for calculating a first difference pe(t) between a phase of an input signal ps(t) and a local phase pl(t) of the signal produced by said voltage-controlled oscillator (VCO);

means (PEE, FEE) for calculating digital estimates of a phase spe(t) and frequency sfe(t) error of said first difference pe(t);

means (PEE, FEE) for carrying out a separate adaptive digital filtering of said digital estimates of phase spe(t) and frequency sfe(t) errors, which derive respective phase fpe(t) and frequency ffe(t) filtered digital signals;

means (COM) for calculating a command signal com(t) for said voltage controlled oscillator (VCO) formed by a combination of the contributions of said phase fpe(t) and frequency ffe(t) filtered digital signals.

* * * * *